United States Patent

Manabe et al.

[11] Patent Number: 5,950,687
[45] Date of Patent: Sep. 14, 1999

[54] LEAD FORMING APPARATUS AND LEAD FORMING METHOD

[75] Inventors: Hidekazu Manabe; Kaoru Ishihara, both of Tokyo, Japan

[73] Assignee: Mitsubishi Denki Kabushiki Kaisha, Tokyo, Japan

[21] Appl. No.: 08/739,286

[22] Filed: Oct. 29, 1996

[30] Foreign Application Priority Data

Jul. 4, 1996 [JP] Japan .................................. 8-174517

[51] Int. Cl.$^6$ .................................................. B21F 45/00
[52] U.S. Cl. ............................................................. 140/105
[58] Field of Search ............................................. 140/105

[56] References Cited

U.S. PATENT DOCUMENTS

| | | | |
|---|---|---|---|
| 4,945,953 | 8/1990 | Kronberg | 140/105 |
| 5,535,789 | 7/1996 | Takahashi et al. | 140/105 |

FOREIGN PATENT DOCUMENTS

| | | |
|---|---|---|
| 2-284455 | 11/1990 | Japan . |
| 4-10459 | 1/1992 | Japan . |
| 4-196257 | 7/1992 | Japan . |
| 5-275589 | 10/1993 | Japan . |
| 7-30031 | 1/1995 | Japan . |

OTHER PUBLICATIONS

Patent Abstracts of Japan, vol. 14, No. 213 (E–923), May 7, 1990, JP 2–49459, Feb. 19, 1990.
Patent Abstracts of Japan, vol. 14, No. 282 (E–942), Jun. 19, 1990, JP 2–90659, Mar. 30, 1990.
Patent Abstracts of Japan, vol. 18 , No. 372 (E–1577), Jul. 13, 1994, JP 6–104360, Apr. 15, 1994.
Patent Abstracts of Japan, JP 8–037263, Feb. 6, 1996.

*Primary Examiner*—Lowell A. Larson
*Attorney, Agent, or Firm*—Oblon, Spivak, McClelland, Maier & Neustadt, P.C.

[57] ABSTRACT

Four lead bending devices (40) are so disposed as to surround the forming die (31). In each of the lead bending devices (40), a rotary lever (41) extends from a rotary strut (43) and a lever guide (42) disposed therebelow holds the rotary lever (41) to prevent deflection of the rotary lever (41). The rotary strut (43) is connected to a driving unit (44). Thus, a lead forming apparatus and a lead forming method are provided to achieve improvement in flatness of end portions of leads, reduction of generation of solder-plating residues by preventing a removal of solder-plate from surfaces of the leads, and easy change of an angle of the end portions of the leads to be formed.

12 Claims, 16 Drawing Sheets

LEAD FORMING APPARATUS AND LEAD FORMING METHOD

BACKGROUND OF THE INVENTION

1. Field of the Invention

The present invention relates to a lead forming apparatus and a lead forming method for a resin-sealed semiconductor device, and more particularly to a lead forming apparatus and a lead forming method for a flat package.

2. Description of the Background Art

A flat package is a kind of resin-sealed semiconductor device. Flat packages include an SOP (Small Outline Package) in which leads extend from two opposite sides of a package and a QFP (Quad Flat Package) in which the leads extend from all of four sides of the package. The flat package is a surface-mount package, and has leads whose end portions are bent in a substantial L-shape so as to be mounted flat on a surface of a predetermined position of a wiring board.

A lead forming method using a background-art lead forming apparatus will be discussed below, referring to FIGS. 17 to 21.

First, as shown in FIG. 17, a QFP 3 having unformed leads 1 is prepared. In FIG. 17, only the leads 1 extending from one pair of two opposite sides of a package body 2 are shown and the leads from the other pair of two opposite sides are omitted.

In a step of FIG. 18, the QFP 3 is mounted on a forming die 4. The forming die 4 has a concave portion to accommodate a lower surface side of the package body 2, and when the package body 2 is inserted therein, the QFP 3 is supported by base portions of the leads 1 (near the package body 2). Then, a holder 5 and forming punches 6 descend from above the forming die 4.

The holder 5 has a concave portion to accommodate an upper surface side of the package body 2, and when the package body 2 is inserted therein, the base portions of the leads 1 are held between the forming die 4 and the holder 5.

When the forming punches 6 fully descend, as shown in FIG. 19, the leads 1 are pushed to bend in accordance with the contour of the forming punches 6. Thus, forming of the leads is completed. Furthermore, the shape of the lead is called a gull-wing shape as resembles a gull wing.

As discussed above, in the lead forming method using the background-art lead forming apparatus, the leads 1 are pushed to bend by the forming punches 6 while the base portions of the leads 1 are held between the forming die 4 and the holder 5 (see FIGS. 18 and 19).

The problem of this method lies in a distortion of the package body 2 produced in a fabrication process of the QFP 3. FIG. 20 schematically illustrates the distortion of the package body 2 (after lead-bending process step). There are a variety of distortions of the package body 2, but for simple illustration, FIG. 20 exaggeratingly shows the package body 2 which is warped upward.

If the package body 2 is warped upward, an arrangement of leads 1 are accordingly warped as shown in FIG. 20. When the warped leads 1 are held between the forming die 4 and the holder 5 as shown in FIG. 18, the arrangement of the leads 1 are temporarily corrected to be a linear arrangement. Then, the temporarily-corrected leads 1 are pushed to bend by the forming punches 6 and the end portions of the leads 1 after bending are linearly arranged. However, when the base portions of the leads 1 are released from the forming die 4 and the holder 5, the leads 1 are warped again, and as a result, only some of the end portions of the leads 1 comes into contact with a plane.

FIG. 21 schematically illustrates the QFP 3 after lead-bending process step. In FIG. 21, the end portion of a lead L1 which is located in a substantial center portion of the package body 2 is in contact with the plane, but the end portions of leads L2 and L3 away from the lead L1, nearer to the corner of the package body 2, are out of contact with the plane. That is because the package body 2 is warped upward. The lead L3 furthermost from the plane is located endmost in a side of the package body 2. In general, the flatness of the leads is defined by a distance d between the plane and the end portion of the lead furthermost therefrom. Normally, the flatness is required to be not more than 100 μm, or 50 μm.

Since the lead out of contact with the plane may cause a junction failure in joining the lead with the wiring board, the problem of distortion of the package body 2 must be overcome, but has not been fully overcome until now. As the second best method, correcting the end portions of the leads in the lead-bending process step may be proposed, but the background-art lead forming apparatus and method have no construction or process step for the correction.

Further, in the lead forming method using the background-art lead forming apparatus, the leads 1 are bent by the forming punches 6 as shown in FIG. 18 and hence the forming punches 6 are brought into contact with surfaces of the leads 1. The surfaces of the leads 1 are generally solder-plated for soldering onto the wiring board. When the surfaces of the leads 1 come into contact with the forming punch 6, the solder-plate is removed and solder-plating residues like spikes are generated. The solder-plating residues may fall on the forming die 4 and the lead 1 with the solder-plating residues deposited thereon may be shipped. A more disadvantageous case is that the solder-plating residues which are deposited on the forming punches 6 ascend and descend again in a process for the next leads. The amount of solder-plating residues generated in one process is small, but becomes larger during a repeat of processes while the solder-plating residues are left on the forming punches 6. When the amount of solder-plating residues become larger to some extent, the solder-plating residues fall from the forming punches 6 to be deposited upon the leads 1 and may short-circuit between the leads 1, thereby causing a faulty operation.

Furthermore, in the lead forming method using the background-art lead forming apparatus, the angle of the end portion of the lead 1 to be formed is fixedly determined in accordance with the shapes of the forming punch 6 and the forming die 4. Therefore, changing the angle to be formed is not easy since it creates a need for changing the forming punch 6 and the forming die 4 themselves.

SUMMARY OF THE INVENTION

The present invention is directed to a lead forming apparatus for performing a bending process for leads having a first angle in a flat package. According to a first aspect of the present invention, the lead forming apparatus comprises: prebending means for performing a prebending process to bend the leads having the first angle so that their main portions may form a second angle and their end portions may form a third angle; and secondary bending means for performing a secondary bending process to bend the end portions of the leads having the third angle into a fourth angle. In the lead forming apparatus of the first aspect, the secondary bending means includes a forming die on which a package body of the flat package having the leads after the prebending process is mounted, lead bending means disposed so as to surround the forming die in accordance with an arrangement of the leads extending from the package body, and a forming punch disposed in accordance with the arrangement of the leads, moving swingingly to come into contact with the end portions of the leads having the third angle in the secondary bending process for the end portions of the leads having the third angle, the lead bending means includes a rotary lever which is so rotatable as to change an angle of its mounting surface with respect to a horizontal position while the end portions of the leads having the third angle are mounted thereon, and the end portions of the leads having the third angle are bent into a fourth angle by rotating the rotary lever so that the mounting surface may get near the forming punch while the forming punch is in contact with the end portions of the leads having the third angle.

According to a second aspect of the present invention, in the lead forming apparatus of the first aspect, the package body includes a lower surface side located in a direction of bending the leads and an upper surface side opposite to the lower surface side, which are separated with the leads as boundary, the secondary bending means includes a package holding jig which comes into contact with a substantial center portion of the upper surface side of the package body in the secondary bending process for the end portions of the leads having the third angle, the forming die has a concave portion for accommodating the lower surface side of the package body having the leads after the prebending process, the concave portion has such a size as base portions of the leads can support the flat package when the package body having the leads after the prebending process is inserted therein, and the package holding jig controls a move of the package body while the base portions of the leads support the flat package in the secondary bending process for the end portions of the leads having the third angle.

According to a third aspect of the present invention, in the lead forming apparatus of the second aspect, the rotary lever is one of divided pieces of a cylinder in a direction of sectional radius, the lead bending means includes a rotary strut of cylindrical shape formed integrally with the rotary lever so that a cylindrical surface of the rotary strut and that of the rotary lever may fit together, for rotating the rotary lever in association with its rotation, and a lever guide having a guide surface which is so shaped as to fit to the cylindrical surface of the rotary lever, for holding the rotary lever with the guide surface, and the lead bending means is disposed so that the end portions of the leads having the third angle may come into contact with a flat surface of the rotary lever which is the mounting surface while the package body is mounted on the forming die.

According to a fourth aspect of the present invention, in the lead forming apparatus of the third aspect, the lead bending means includes driving means for rotating the rotary strut, and the driving means has a motor which is connected to an end of the rotary strut and rotates the rotary strut at a predetermined angle in response to a control signal externally applied.

According to a fifth aspect of the present invention, in the lead forming apparatus of the third aspect, the lead bending means includes driving means for rotating the rotary strut, the driving means includes a side lever extending horizontally from a cylindrical side surface of the rotary strut opposite to that provided with the rotary lever, and pushing-down means disposed in an upper portion of the side lever, for applying a force to push down the side lever, and the rotary strut is rotated at a predetermined angle by pushing down the side lever by a predetermined distance.

According to a sixth aspect of the present invention, the lead forming apparatus of the fifth aspect further comprises: a die set including an upper die set which vertically moves and a lower die set. In the lead forming apparatus of the sixth aspect, the pushing-down means has a rod which is so extensible as to come into contact with the side lever, and a cylinder for extending the rod with air pressure, the rotary lever, the lever guide and the rotary strut are mounted on the lower die set, the cylinder is disposed on a position of the upper die set corresponding to the upper portion of the side lever, and the upper die set descends and the rod extends to push down the side lever in the secondary bending process for the leads having the third angle.

The present invention is also directed to a lead forming method. According to a seventh aspect of the present invention, the lead forming method comprises steps of: (a) bending leads which are unformed into a first angle after mounting a flat package having the unformed leads on a first forming die having a slope of the first angle on its peripheral surface; (b) performing a prebending process to bend the leads having the first angle so that their main portions may form a second angle and their end portions may form a third angle by a first forming punch which moves swingingly to come into contact with the end portions of the leads after mounting the flat package having the leads bent into the first angle on a second forming die having a slope of the second angle and a slope of the third angle provided on its peripheral surface in this order from its mounting surface towards its periphery; and (c) performing a secondary bending process to bend only the end portions of the leads having the third angle into a fourth angle while a second forming punch moves swingingly so as to come into contact with the main portions of the leads having the second angle after mounting the flat package having the leads after the prebending process on a third forming die having a slope of the second angle on its peripheral surface. In the lead forming method of the seventh aspect, the step (c) includes a step of rotating a rotary lever of a lead bending means which is so disposed as to surround the third forming die in accordance with an arrangement of the leads extending from a package body, being so rotatable as to change an angle of its mounting surface with respect to a horizontal position, so that the mounting surface of the rotary lever may get near the second forming punch while the second forming punch is in contact with the end portions of the leads after mounting the end portions of the leads having the third angle on the mounting surface.

According to an eighth aspect of the present invention, in the lead forming method of the seventh aspect, the package body includes a lower surface side located in a direction of bending the leads and an upper surface side opposite to the lower surface side, which are separated with the leads as boundary, the third forming die has a concave portion for accommodating the lower surface side of the package body, and the step (c) includes a step of controlling a move of the package body by a package holding jig which comes into contact with a substantial center portion of the upper surface side of the package body while the base portions of the leads support the flat package when the flat package having the leads after the prebending process is inserted in the concave portion. According to a ninth aspect of the present invention, in the lead forming method of the eighth aspect, the first angle is smaller than the second angle, and the step (a) includes a step of bending the leads which are unformed into the first angle by descending the third forming punch having such a slope as to fit to the slope of the first angle from above the unformed leads to hold the unformed leads between the third forming punch and the slope of the first angle.

According to a tenth aspect of the present invention, in the lead forming method of the eighth aspect, the first angle is smaller than the second angle, and the step (a) includes a step of bending the leads which are unformed into the first angle by descending a roller from above the unformed leads and rotating the roller to move along the unformed leads to hold the unformed leads between a cylindrical surface of the roller and the slope of the first angle.

In the lead forming apparatus of the first aspect, since the secondary bending process is performed by rotating the rotary lever so that its mounting surface may get near the forming punch while the forming punch is in contact with the end portions of the leads, the end portions of the leads are formed so as to be in contact with the same flat surface. That improves the flatness of the leads. Moreover, the angle of the end portions of the leads to be formed can be easily changed by controlling the rotating angle of the rotary lever of the lead bending means, and therefore the time and labor for changing the angle to be formed can be reduced.

In the lead forming apparatus of the second aspect, only the package holding jig controls the movement of the package body while the base portions of the leads support said float package during the secondary bending process. Therefore, the arrangement of the leads is not corrected even if the arrangement of the leads has a distortion due to a distortion of the package body and only the end portions of the leads are bent. Thus, the end portions of the leads can be formed so as to surely come into contact with the same plane, regardless of the distortion in the arrangement of the leads.

The lead forming apparatus of the third aspect has the lead bending means which can overcome a problem of deflection of the rotary lever and the like since the rotary lever is held by the lever guide.

In the lead forming apparatus of the fourth aspect, the motor rotates the rotary strut at the predetermined angle, and therefore easy control of rotation and precise determination of rotating angle of the rotary strut can be achieved.

In the lead forming apparatus of the fifth aspect, the rotary strut is rotated at the predetermined angle by pushing down the side lever which extends horizontally from the rotary strut by the predetermined distance. Therefore, the lead forming apparatus of the fifth aspect has a simpler construction than that using a motor and the like to rotate the rotary strut.

In the lead forming apparatus of the sixth aspect, the lead bending means is incorporated in the die set which is generally used in lead forming apparatus. Therefore, the lead forming apparatus of more practical construction can be provided.

In the lead forming method of the seventh aspect, the process of bending the end portions of the leads includes two separate process steps, i.e., the prebending step and the secondary bending step. In the secondary bending step, only the end portions of the leads having the third angle are bent into the fourth angle by rotating the rotary lever so that the mounting surface of the rotary lever may get near the second forming punch while the second forming punch is in contact with the end portions of the leads, and therefore only the end portions of the leads are corrected so as to come into contact with the same plane. In the prebending and secondary bending steps, using the first and second forming punches which move swingingly, it is possible to prevent damages of the surfaces of the leads, and in particular, if the surfaces of the leads are solder-plated, it is possible to prevent a removal of the solder-plate and generation of the solder-plating residues.

In the lead forming method of the eighth aspect, the package holding jig which comes into contact with the substantial center portion of the upper surface side of the package body controls the movement of the package body while the base portions of the leads support the flat package. Therefore, the arrangement of the leads are not corrected and only the end portions of the leads are bent even if the arrangement of the leads has a distortion due to the distortion of the package body. Thus, the end portions of the leads can be formed so as to surely come into contact with the same plane regardless of the distortion of the arrangement of the leads.

In the lead forming method of the ninth aspect, the first angle is smaller than the second angle, such a gentle angle that the solder-plate may not be removed when the third forming punch descends from above the unformed leads to bend the leads, and therefore it is possible to prevent generation of the solder-plating residues.

In the lead forming method of the tenth aspect, the first angle is smaller than the second angle, such a gentle angle that the solder-plate may not be removed when the roller descends from above the unformed leads and rotates to move along the unformed leads to bend the leads, and therefore it is possible to prevent generation of the solder-plating residues.

An object of the present invention is to provide a lead forming apparatus and a lead forming method for improvement in flatness of the end portion of the lead regardless of the distortion of the package body of the QFP, reduction of generation of solder-plating residues by preventing a removal of the solder-plate from the surface of the lead, and easy change of the angle of the end portion of the lead to be formed.

These and other objects, features, aspects and advantages of the present invention will become more apparent from the following detailed description of the present invention when taken in conjunction with the accompanying drawings.

DESCRIPTION OF THE PREFERRED EMBODIMENTS

A. The First Preferred Embodiment

A lead forming apparatus and a lead forming method in accordance with the first preferred embodiment of the present invention will be discussed below, referring to FIGS. 1 to 9.

<A-1. Lead Forming Process>

Figure 1:
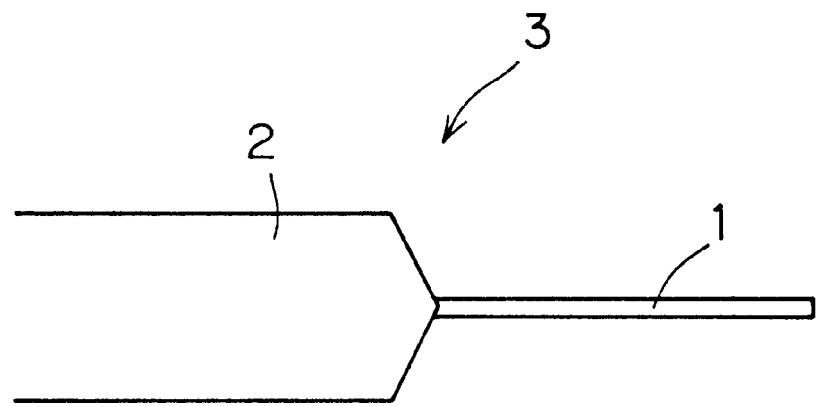
FIGS. 1 to 6 illustrate lead-forming process steps by a lead forming method in accordance with the present invention.

FIGS. 1 to 6 illustrate lead-forming process steps in sequence. First, as shown in FIG. 1, the QFP 3 having the lead 1 which is unformed is prepared. In FIG. 1, only the lead 1 extending from one side of the package body 2 is shown and leads from the other sides are omitted.

Figure 2:
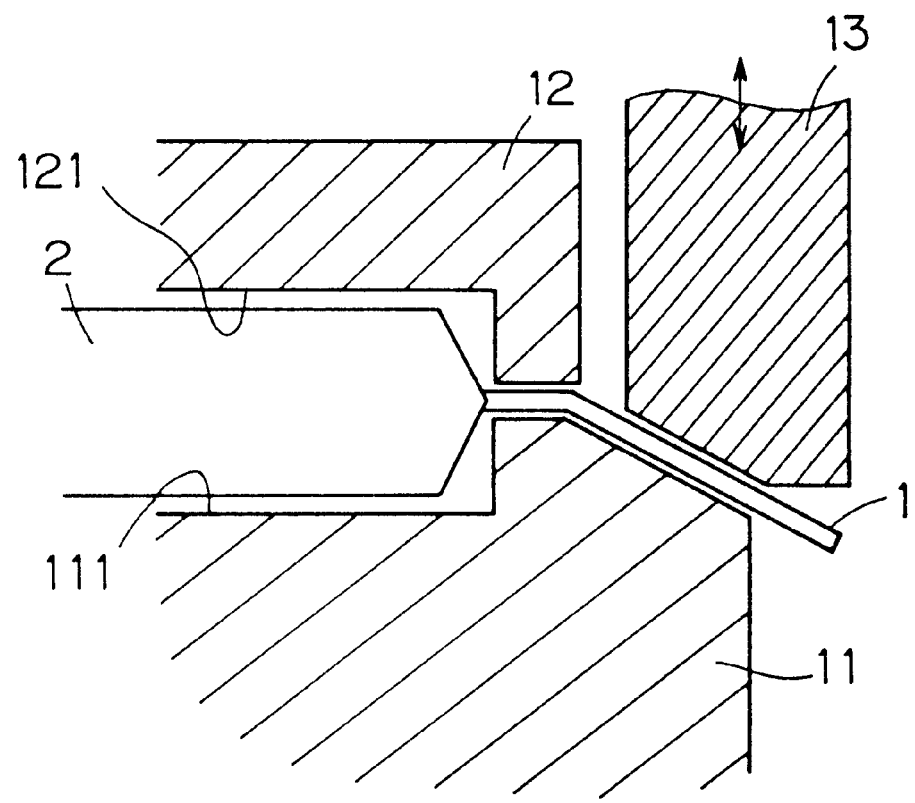

In a step of FIG. 2, the QFP 3 is mounted on a forming die 11 (the first forming die) having a slope of the first angle in a peripheral portion. The forming die 11 has a concave portion 111 to accommodate the lower surface side of the package body 2 (with the lead 1 as the boundary, the lower surface side refers to a side located in a direction of bending the lead, and the upper surface side refers to the other side), and when the package body 2 is inserted therein, the QFP 3 is supported by a base portion of the lead 1 (near the package body 2). Then, a holder 12 and a forming punch 13 (the third forming punch) descend from above the forming die 11.

The holder 12 has a concave portion 121 to accommodate the upper surface side of the package body 2, and when the package body 2 is inserted therein, the base portion of the lead 1 is held between the forming die 11 and the holder 12.

When the forming punch 13 fully descends, as shown in FIG. 2, the lead 1 is pushed to bend while being held between the forming punch 13 and the forming die 11.

The first angle of the slope in the peripheral portion of the forming die 11 and an angle of a slope of the end portion of the forming punch 13 (equivalent to the first angle) are each gentler than the bend angle of the lead 1 of the finished QFP 3. That prevents a removal of the solder-plate from the surface of the lead 1 when the forming punch 13 comes into contact with the surface of the lead 1.

In this step, a roller which rotates to move along the lead 1 may be used, instead of the forming punch 13. In this case, with rotation of the roller, the lead 1 is pushed to bend while being held between a cylindrical side surface of the roller and the slope in the peripheral portion of the forming die 11.

Figure 3:
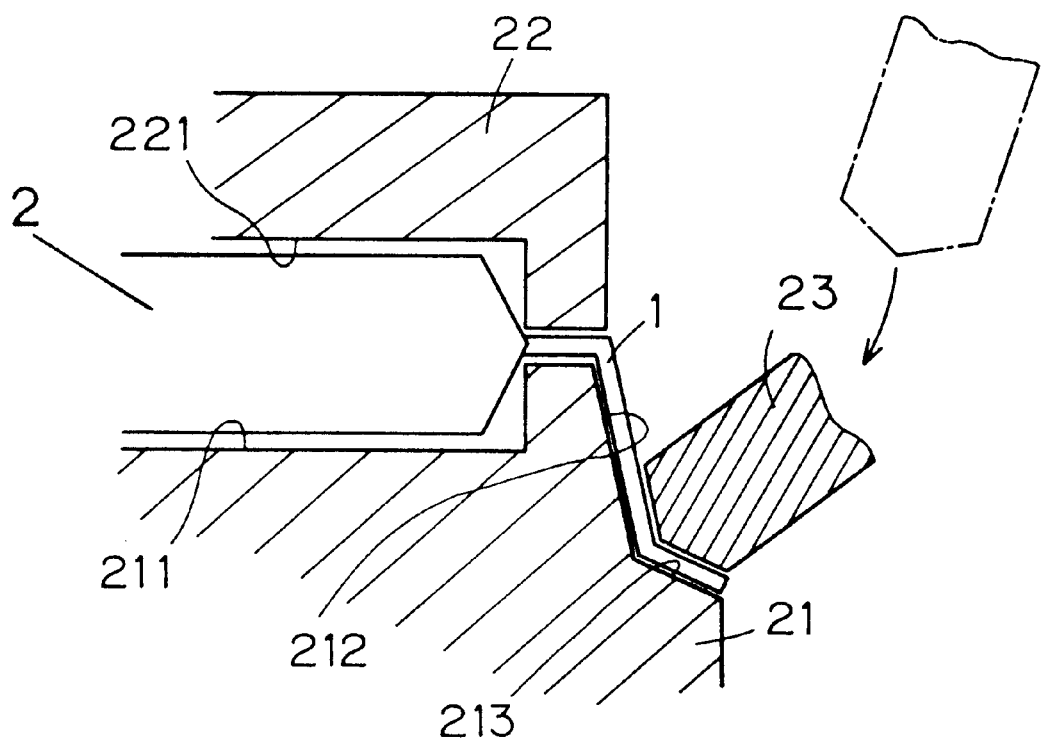

In a subsequent step of FIG. 3, the QFP 3 is moved onto a forming die 21 (the second forming die). The forming die 21 has a concave portion 211 to accommodate the lower surface side of the package body 2, and when the package body 2 is inserted therein, the QFP 3 is supported by the base portion of the lead 1. Then, a holder 22 descends from above the forming die 21.

The holder 22 has a concave portion 221 to accommodate the upper surface side of the package body 2, and when the package body 2 is inserted therein, the base portion of the lead 1 is held between the forming die 21 and the holder 22.

Then, a forming punch 23 (the first forming punch) moves swingingly from diagonally above the forming die 21 to come into contact with the lead 1 and moves on while pushing the lead 1 against a slope in the peripheral portion of the forming die 21. By holding the lead 1 between the forming die 21 and the forming punch 23, the lead 1 is formed in a fixedly determined shape in accordance with the shapes of the forming die 21 and the forming punch 23. The above process is referred to as a prebending process. Accordingly, the construction for performing the prebending process is referred to as a prebending means.

The forming die 21 is provided with two slopes having different angles in its peripheral portion. They are a slope 212 having the second angle to define the gradient of the main portion of the lead 1 and a slope 213 having the third angle to define the gradient of the end portion of the lead 1. Accordingly, the lead 1 has two bent portions and forms a gull-wing shape.

Figure 4:
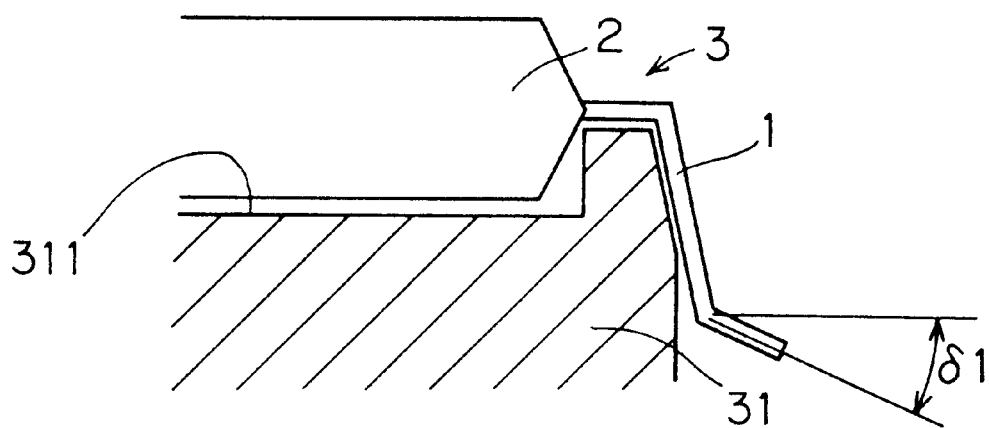

Subsequently, the QFP 3 after the prebending process is moved on a forming die 31 (the third forming die) as shown in FIG. 4. The forming die 31 has a concave portion 311 to accommodate the lower surface side of the package body 2, and when the package body 2 is inserted therein, the QFP 3 is supported by the base portion of the lead 1. The forming die 31 is provided with a slope having the second angle which is the same as the angle of the main portion of the lead 1 in its peripheral portion.

Furthermore, the bend angle $\delta 1$ (the third angle) of the end portion of the lead 1 in this stage is approximately 10° with respect to a horizontal position, which is larger than an eventual bend angle.

Figure 5:
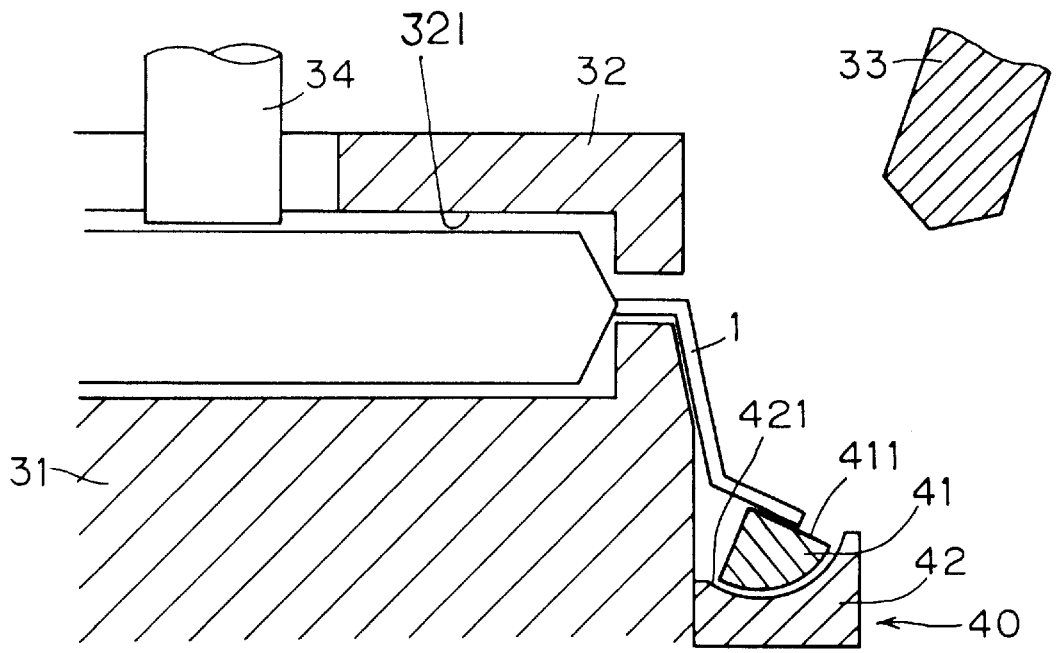

Next, in a step of FIG. 5, a holder 32 and a holding jig 34 descend from above the forming die 31. Then, a forming punch 33 (the second forming punch) moves swingingly from diagonally above the forming die 31.

The holder 32 has a concave portion 321 to accommodate the upper surface side of the package body 2. When the package body 2 is inserted therein, the base portion of the lead 1 is not held between the forming die 31 and the holder 32 and there is a predetermined clearance between the upper surface side of the base portion of the lead 1 and the holder 32. Instead, a package holding jig 34 comes into contact with a substantial center portion of the upper surface side of the package body 2.

The above construction where the base portion of the lead 1 is not held between the forming die 31 and the holder 32 prevents correction of the arrangement of the leads 1. The holder 32, which does not hold the lead 1, is provided to control a jumping of the lead 1 in a secondary bending process for the end portion of the lead discussed later.

In this step, four lead bending devices 40 are arranged so as to surround the forming die 31 correspondingly to arrangements of the leads 1 on the four sides of the forming die 31, respectively, for performing the secondary bending process for the end portions of the leads 1.

The lead bending device 40 consists of a rotary lever 41 and a lever guide 42 for holding the rotary lever 41. The section of the rotary lever 41 which contributes to the secondary bending of the end portion of the lead 1 is quarter-circular. The lead bending device 40 is disposed so that the end portion of the lead 1 may come into contact with a flat surface 411 of the rotary lever 41 when the QFP 3 is placed on the forming die 31. Furthermore, the shape of the section of the rotary lever 41 is not limited to a quarter of circle, but may be one-third or one-sixth of circle, which is one of divided pieces of a cylinder in a direction of sectional radius, only if it has a mechanical strength for the secondary bending process for the end portion of the lead 1.

The rotary lever 41 slides on a guide surface 421 of the lever guide 42. The rotary lever 41 is disposed so that the flat surface 411 may be substantially parallel with the bend of the angle $\delta 1$ of the end portion of the lead 1 when the QFP 3 is placed on the forming die 31.

Figure 6:
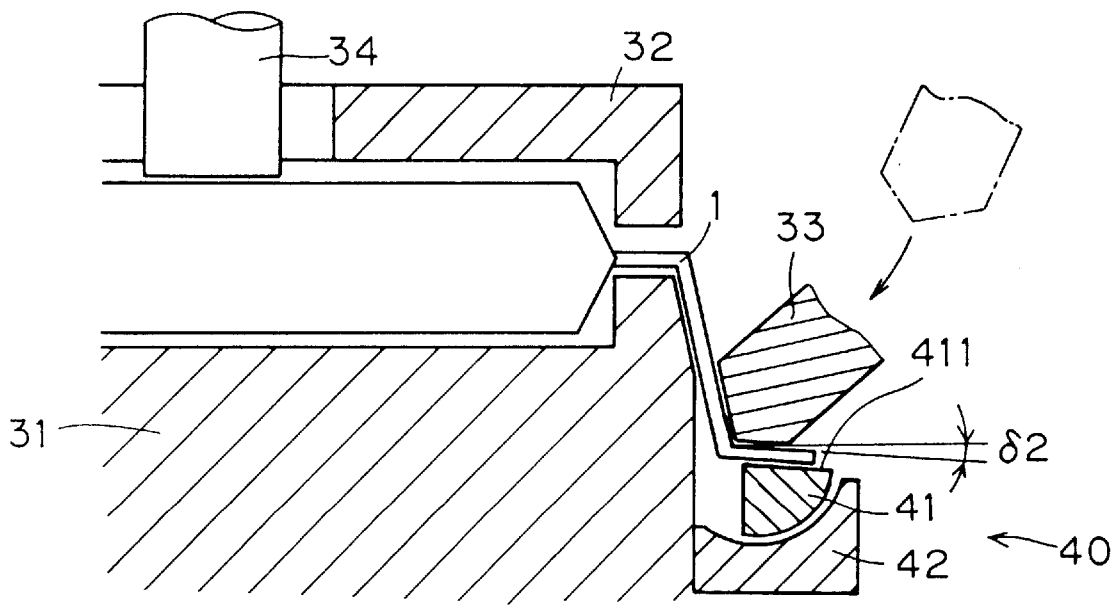

In a step of FIG. 6, the rotary lever 41 rotates so that the bend angle $\delta 1$ of the end portion of the lead 1 may become smaller, in other words, the end portion of the lead 1 may get closer to horizontal position, and the forming punch 33 moves swingingly to come into contact into the lead 1, and then the lead 1 is held between the rotary lever 41 and the forming die 31 and the forming punch 33. Thus, reforming of the end portion of the lead 1, i.e., the secondary bending is completed. The above construction for performing the second bending process is referred to as secondary bending means.

After the secondary bending process, the bend angle δ2 (the fourth angle) of the end portion of the lead 1 is approximately 2° or 4°. In the step of FIG. 6, however, the rotary lever 41 rotates until the flat surface 411 becomes substantially horizontal, i.e., approximately 0°, taking into account a spring-back due to the elasticity of the lead 1.

<A-2. Construction of Apparatus>

A construction of the lead forming apparatus 100 to perform the above secondary bending process for the end portions of the leads will be discussed, referring to FIGS. 7 to 9.

Figure 7:
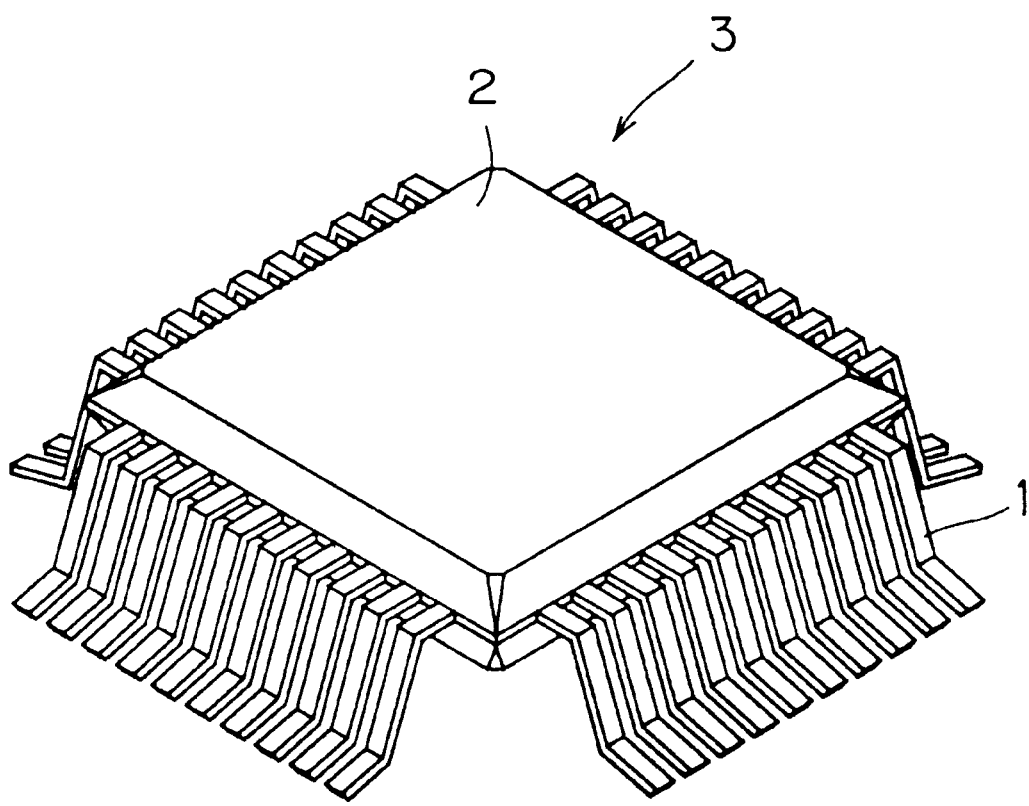
FIG. 7 is a perspective view of a QFP after a prebending process.

FIG. 7 is a perspective view of the QFP 3 after the prebending process for the end portion of the lead 1 through the steps shown in FIGS. 1 to 3. In this figure, the end portion of the lead 1 has the bend angle δ1 (see FIG. 4) at approximately 10° with respect to the horizontal position.

Figure 8:
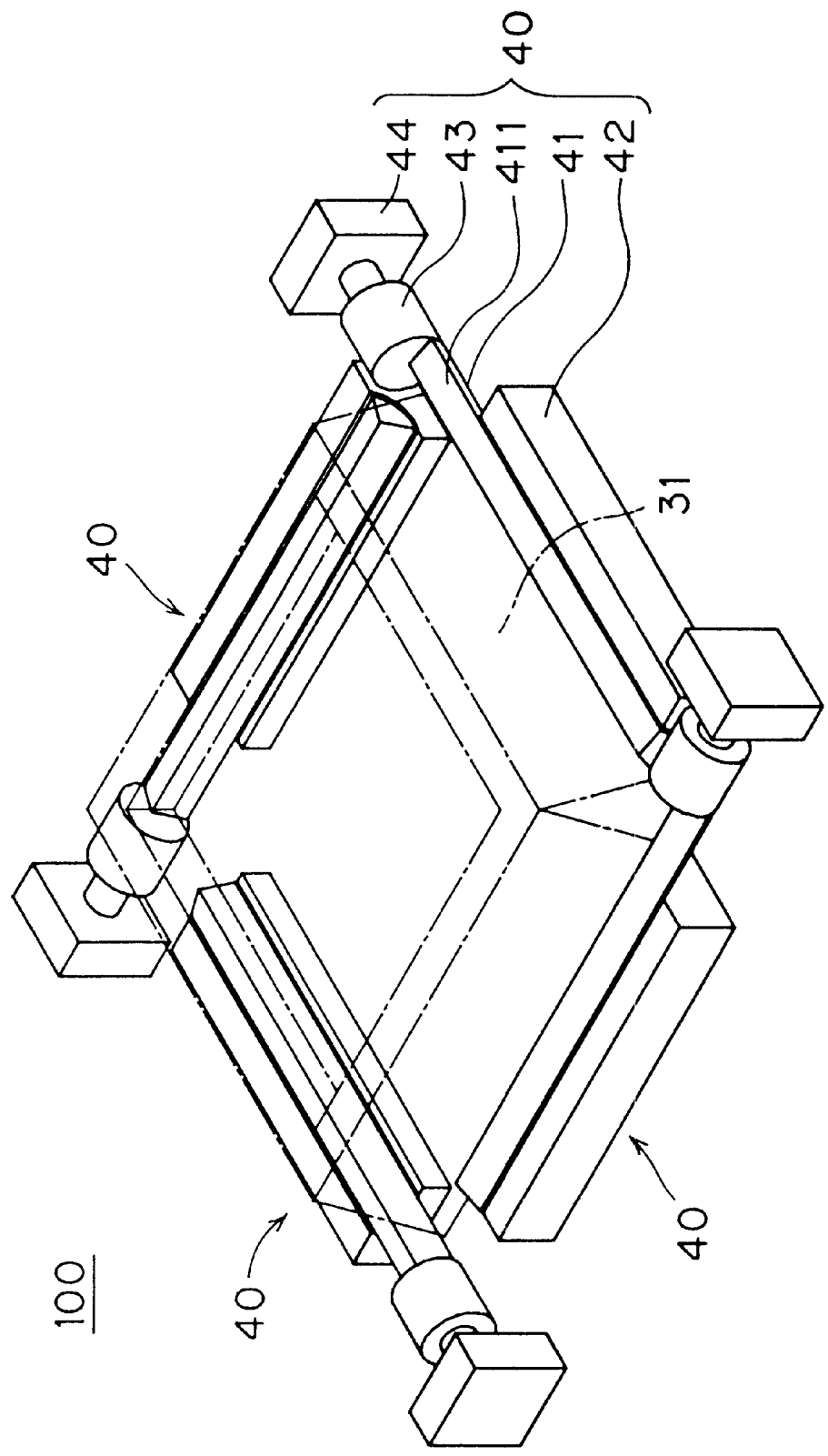
FIG. 8 is a perspective view showing a construction of a lead forming apparatus in accordance with a first preferred embodiment of the present invention.

FIG. 8 is a perspective view showing the construction of the lead forming apparatus 100. In this apparatus 100, four lead bending devices 40 are disposed so as to surround the forming dies 31 having a rectangular outline.

As shown in FIG. 8, the rotary lever 41 of the lead bending device 40 extends from a rotary strut 43 and the lever guide 42 is disposed therebelow to hold the rotary lever 41, thereby preventing deflection of the rotary lever 41.

The rotary strut 43 is connected to a driving unit 44. The driving unit 44 has a mechanism for supplying the rotary strut 43 with a torque, such as a servo motor, and a control device (motor control device) for the rotational mechanism, to rotate the rotary strut 43 at a predetermined angle in response to a control signal which is externally applied. The internal construction of the driving unit 44 will not be discussed in detail since it is little concerned with the present invention.

The lead bending devices 40 are staggered, as shown in FIG. 8, so that the rotary struts 43 and driving units 44 of the adjacent lead bending devices 40 may not hamper each other.

The rotary levers 41 are arranged at such angle as the end portions of the leads 1 may come into contact with the flat surfaces 411 of the rotary levers 41 in substantial parallel, i.e., substantially parallel with the bend angle δ1 of the end portions of the leads 1, when the lower surface side of the package body 2 is inserted in the forming die 31 (indicated by one-dot chain line). In this step, all the end portions of the leads 1 do not come into contact with the flat surfaces 411 of the rotary levers 41 because of distortion in arrangement of the leads 1, as discussed earlier, but this causes no problem.

Figure 9:
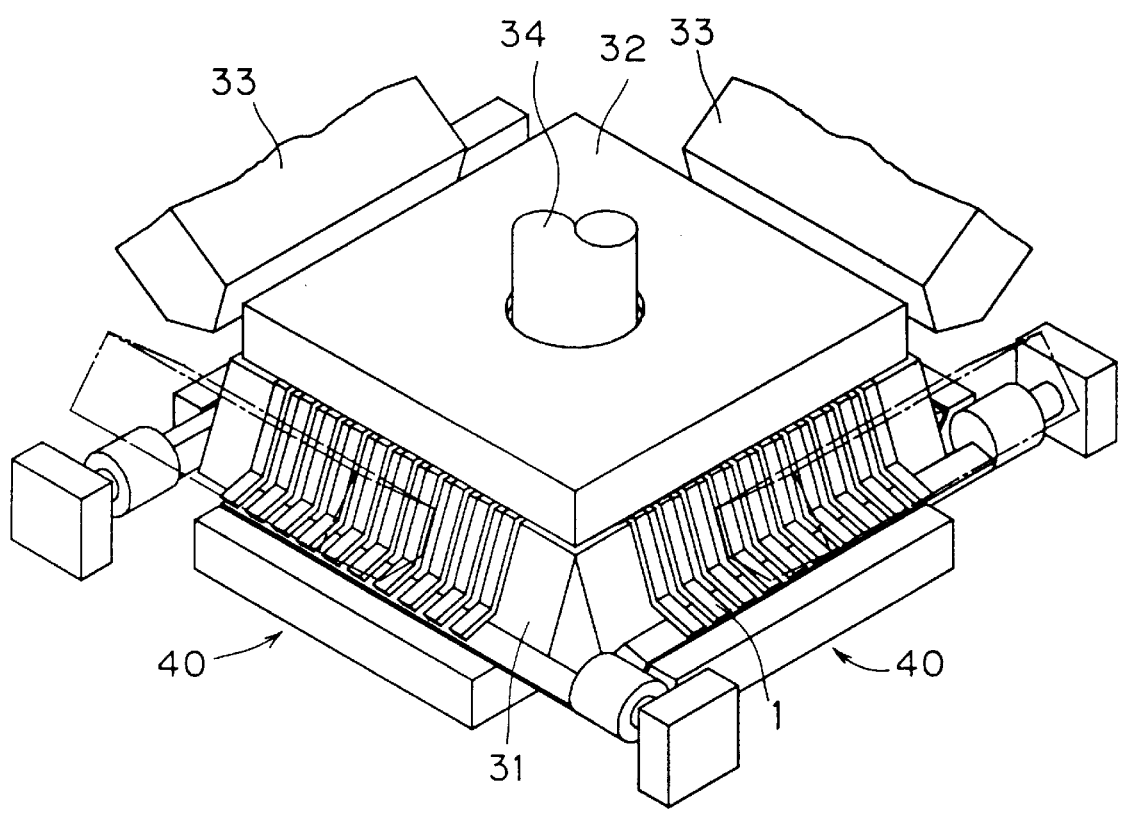
FIG. 9 is a perspective view illustrating a secondary bending process step for the QFP using the lead forming apparatus in accordance with the first preferred embodiment of the present invention.

FIG. 9 is a perspective view illustrating the step of FIG. 5, where the QFP 3 (not shown) is mounted on the forming die 31, the holder 32 is placed to cover the QFP 3 and the package holding jig 34 is in contact with the center portion in the upper surface side of the package body 2. In FIG. 9, the forming punches 33 are moving swingingly from diagonally above the forming dies 31 towards the end portions of the leads 1. The four forming punches 33 are arranged correspondingly to the four lead bending devices 40, but for simple illustration, two forming punches 33 on this side of the paper are represented by one-dot chain lines in FIG. 9.

Furthermore, although the lead forming apparatus 100 for lead forming of the QFP 3 has the four lead bending devices 40, as discussed above, the lead forming apparatus 100 for lead forming of the SOP may have only two lead bending devices 40 opposed to each other.

<A-3. Characteristic Action and Effect>

In the lead forming method of the first preferred embodiment, to bend the end portions of the leads 1, two separate steps, i.e., the prebending step and the secondary bending step, are performed as discussed above. Further, the lead forming apparatus of the first preferred embodiment has the construction where the base portions of the leads 1 are not held between the holder 32 and the forming die 31 to bend only the end portions of the leads 1, so that the entire arrangement of the leads 1 is not corrected but only the end portions of the leads 1 are corrected to come into contact with the same plane. Therefore, the flatness of the leads 1 is improved and better connection between the leads and the wiring board is achieved.

Moreover, since the rotary struts 43 are rotated by the driving units 44 with built-in servo motor and the like, the rotary struts 43 are rotated at precise angle with easy control.

In the prebending step for the end portions of the leads 1, the leads 1 of the QFP 3 are bent first at such a gentle angle as the solder-plate may not be removed, and next pushed to bend by the forming punches 23 which moves swingingly without rubbing the surfaces of the leads 1. That prevents a removal of the solder-plate from the surfaces of the leads 1 and generation of the solder-plating residues.

Further, in the secondary bending process for the end portions of the leads 1, it is possible to easily change the angle of the end portions of the leads 1 to be formed by controlling the rotating angle of the rotary levers 41 of the lead bending devices 40.

B. The Second Preferred Embodiment

A lead forming apparatus and a lead forming method in accordance with the second preferred embodiment of the present invention will be discussed below, referring to FIG. 10.

A lead-forming process of the second preferred embodiment is the same as that of the first preferred embodiment shown in FIGS. 1 to 6, and accordingly will not be discussed.

<B-1. Construction of Apparatus>

A construction of the lead forming apparatus 200 to perform the secondary bending step for the end portions of the leads will be discussed, referring to FIG. 10.

Figure 10:
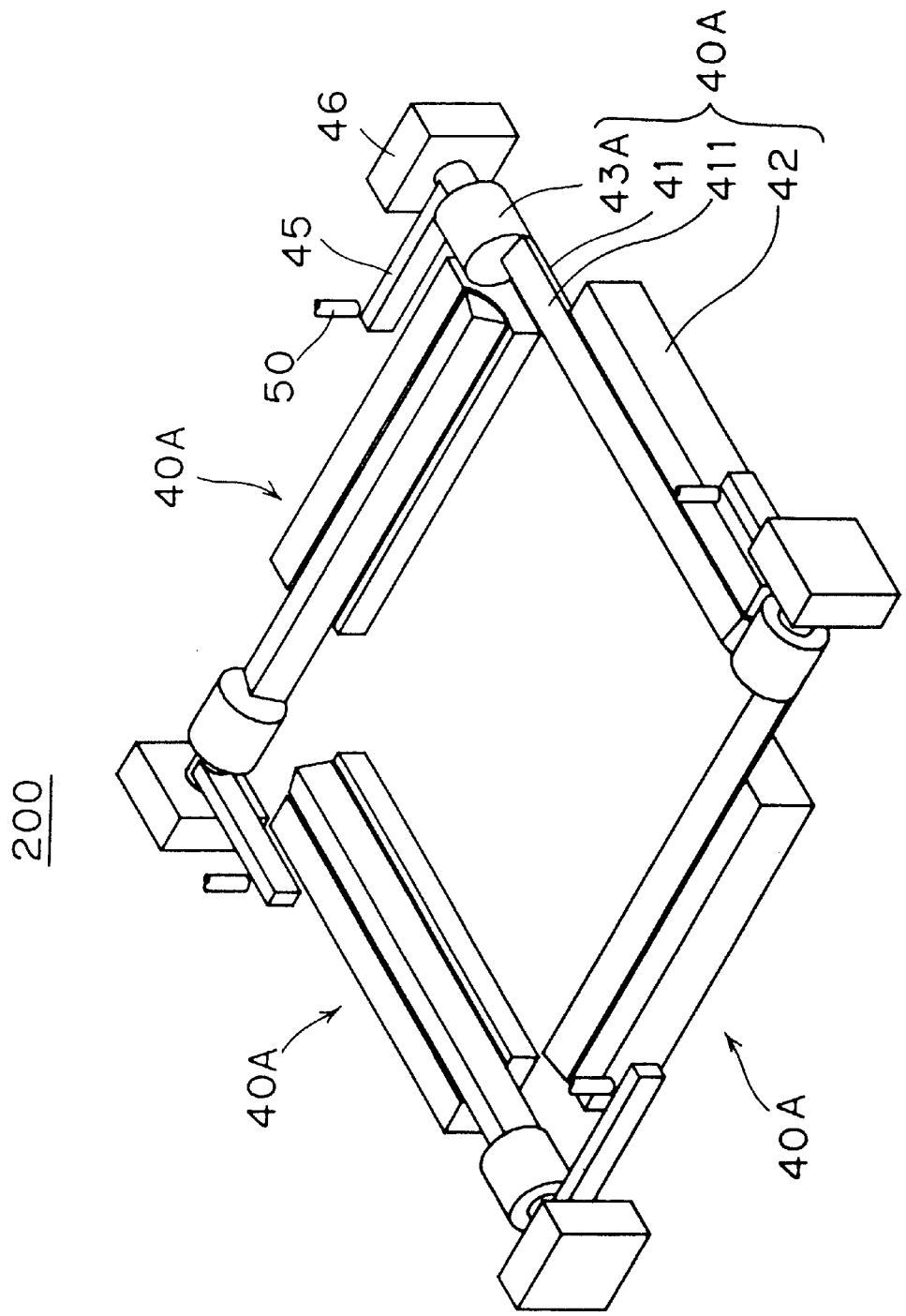
FIG. 10 is a perspective view showing a construction of a lead forming apparatus in accordance with a second preferred embodiment of the present invention.

FIG. 10 is a perspective view showing the construction of the lead forming apparatus 200. In this apparatus 200, four lead bending devices 40A are disposed so as to surround the forming dies 31 (not shown). Furthermore, like elements are given the same reference characters as those of the lead bending device 40 shown in FIG. 8, and redundant discussion will be omitted.

As shown in FIG. 10, the rotary lever 41 of the lead bending device 40A extends from one of cylindrical side surfaces of a rotary strut 43A and a side lever 45 extends from the other side surface of the rotary strut 43A in a horizontal direction. When the end portion of the side lever 45 is pushed down by a pushing-down means 50, the rotary lever 41 is rotated so that its flat surface 411 may reduce the bend angle δ1 (see FIG. 5) of the end portion of the lead 1.

One end of the rotary strut 43A is connected to a supporting member 46. The supporting member 46 has a built-in element to smoothly rotate the rotary strut 43A while supporting the rotary strut 43A, such as a bearing. The internal construction of the supporting member 46 will not be discussed in detail since it is little concerned with the present invention.

As the pushing-down means 50, a device which can apply force in a direction of pushing down the side lever 45 may be used. An exemplary construction thereof will be discussed below.

<B-1-1. The First Construction Example of Pushing-down Means>

Figure 11:
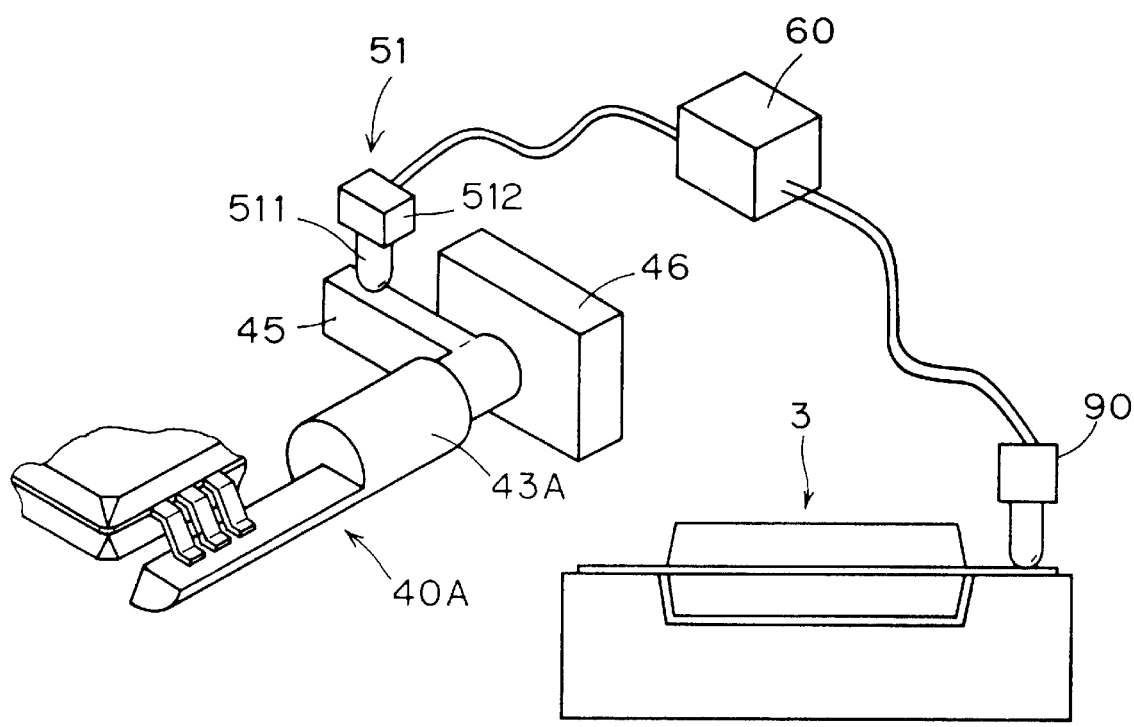
FIGS. 11 to 13 are perspective views illustrating secondary bending process steps for the QFP in accordance with the second preferred embodiment of the present invention.

FIG. 11 is a schematic view showing a connection of the lead bending device 40A, the QFP 3 and an external control device 60. In FIG. 11, a pushing-down unit 51 as the first example of the pushing-down means 50 is provided on the end portion of the side lever 45.

The pushing-down unit 51 pushes down the side lever 45 by a predetermined distance in response to an externally-applied control signal, and includes an extensible rod 511 which is in contact with the side lever 45 and a driving part 512 which extends and retracts the rod 511 in response to the control signal. The driving part 512 is connected to the external control device 60.

The external control device 60 controls an operation of the driving part 512 by converting the angle to be bent in the secondary bending process for the end portion of the lead 1 into vertically-moving distance of the rod 511. The external control device 60 is connected to a board-thickness measuring device 90 for measuring the thickness of the lead 1 of the QFP 3. This connection is useful to change the force of the rod 511 to push down the side lever 45 in accordance with the thickness of the lead 1 and to determine the angle to be bent in the secondary bending process, taking the thickness of the lead 1 into account.

The pushing-down units 51 are disposed correspondingly to the lead bending devices 40A as discussed above and rotate the rotary levers 41 of the lead bending devices 40A. The secondary bending process for the end portions of the leads 1 may be performed using this construction.

<B-1-2. The Second Construction Example of Pushing-down Means>

Figure 12:
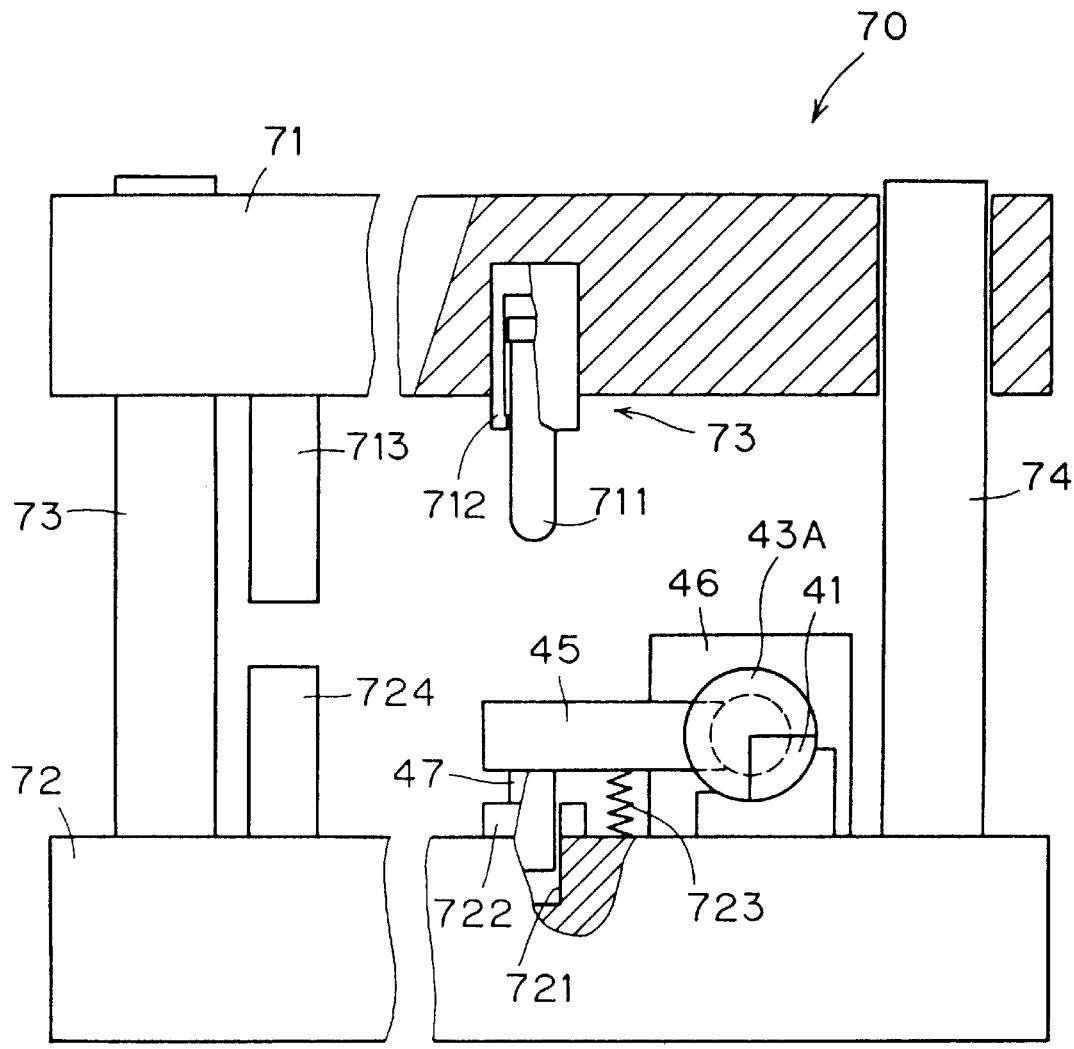

The second construction example of the pushing-down means 50 will be discussed, referring to FIGS. 12 and 13. FIG. 12 illustrates a die set 70 for forming the lead 1 of the QFP 3. The die set 70 includes an upper die set 71 and a lower die set 72. The upper die set 71 moves in a vertical direction along a column 74.

On the lower die set 72, the lead forming apparatus 200 shown in FIG. 10 is mounted. For simple illustration, FIG. 12 shows only one lead bending device 40A.

In FIG. 12, a lever support 47 is attached to a lower end portion of the side lever 45, and inserted into a hole 721 provided in a surface of the lower die set 72. A stopper 722 is provided on an upper portion of the hole 721, through which the lever support 47 is inserted into the hole 721. An elastic member 723 is interposed between a lower surface of the side lever 45 and a surface of the lower die set 72.

The upper die set 71 is provided with a pushing-down cylinder 73 as an example of the pushing-down means 50 on a position corresponding to an upper end portion of the side lever 45. The pushing-down cylinder 73 includes an extensible rod 711 to be brought into contact with the side lever 45 and a cylinder 712 for extending the rod 711 with air pressure. A construction to introduce the air pressure and the like is omitted in FIG. 12.

The upper die set 71 is provided with a stopper 713 extending towards the lower die set 72 and the lower die set 72 is provided with a stopper 724 extending towards the upper die set 71.

Now, an operation will be discussed. When the secondary bending process for the end portion of the lead 1 of the QFP 3 starts, the upper die set 71 begins to descend. When the stoppers 713 and 724 come into contact with each other, the upper die set 71 stops descending, and then the rod 711 of the pushing-down cylinder 73 extends and comes into contact with the side lever 45 to push the side lever 45 down.

Figure 13:
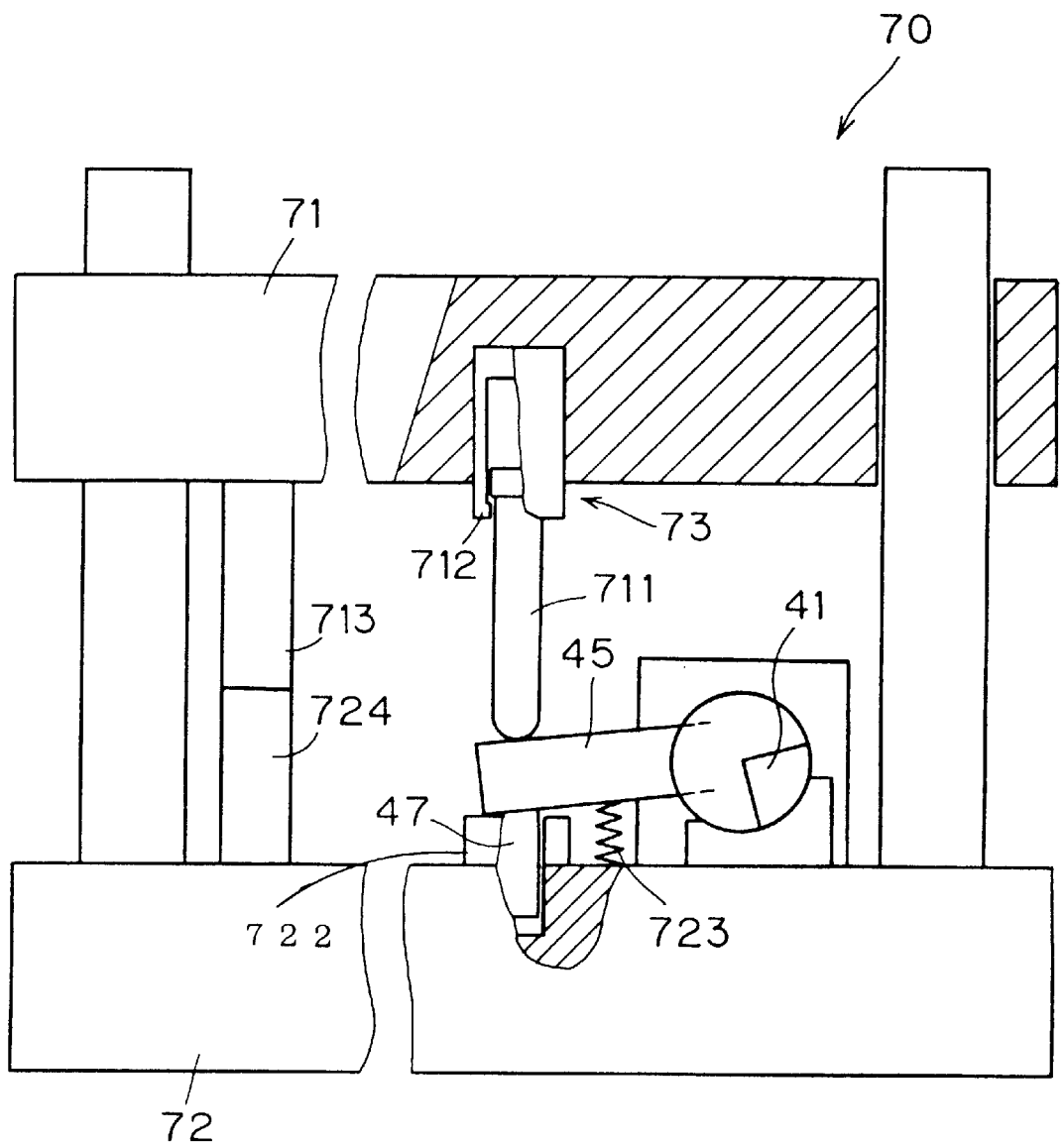

FIG. 13 shows a state when the side lever 45 has stopped pushing down. As shown in FIG. 13, the side lever 45 stops when comes into contact with the stopper 722 and never go down.

On completing the secondary bending process, the upper die set 71 ascends and the rod 711 of the pushing-down cylinder 73 retracts, and then the side lever 45 is urged by the elastic member 723 to move back to its original position.

Furthermore, the forming punch 33 shown in FIG. 5 is attached to the upper die set 71, and descends swingingly when the upper die set 71 descends.

The force of the rod 711 to push down the side lever 45 is changed in accordance with the thickness of the lead 1 by controlling the air pressure to be applied to the pushing-down cylinder 73, and the angle to be bent in the secondary bending process for the end portion of the lead 1 is controlled by controlling the height of the stopper 722.

Thus, only a little improvement of a current lead forming apparatus, i.e., providing the pushing-down cylinder 73 to the die set 70, can realize the present invention.

<B-2. Characteristic Action and Effect>

Since the rotary strut 43A is rotated by the vertical force applied by the pushing-down means 50 and the like as discussed above, the lead forming apparatus has a simpler construction than that using the servo motor and the like. In particular, with the pushing-down means 50 of the second construction example, the present invention is achieved more easily.

C. Variation

In the lead forming apparatus 100 of the first preferred embodiment shown in FIG. 8, the connection between the driving unit 44 of the lead bending device 40 and the external control device is not particularly shown. There may be a connection shown in FIG. 14.

Figure 14:
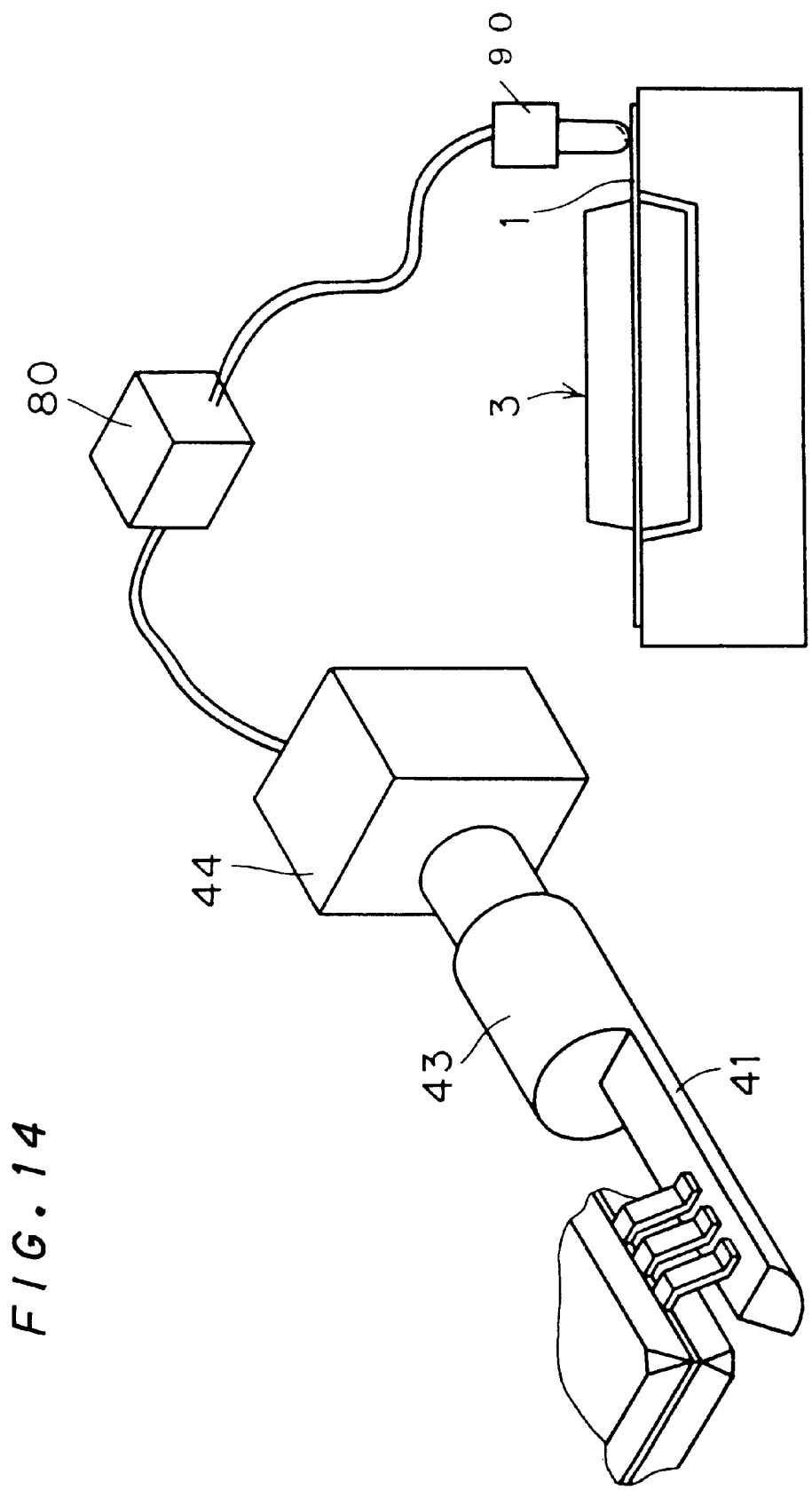
FIGS. 14 to 16 are perspective views showing variations of the present invention.

Specifically, in FIG. 14, the driving unit 44 is connected to an external control device 80. The external control device 80 rotates the rotary strut 43 at the angle to be bent in the secondary bending process for the end portion of the lead 1 of the QFP 3.

Further, the external control device 80 is connected to the board-thickness measuring device 90 for measuring the thickness of the lead 1 of the QFP 3. This construction is useful to change the torque of the rotary strut 43 in accordance with the thickness of the lead 1 and to determine the angle to be bent in the secondary bending process, taking the thickness of the lead 1 into account.

Figure 15:
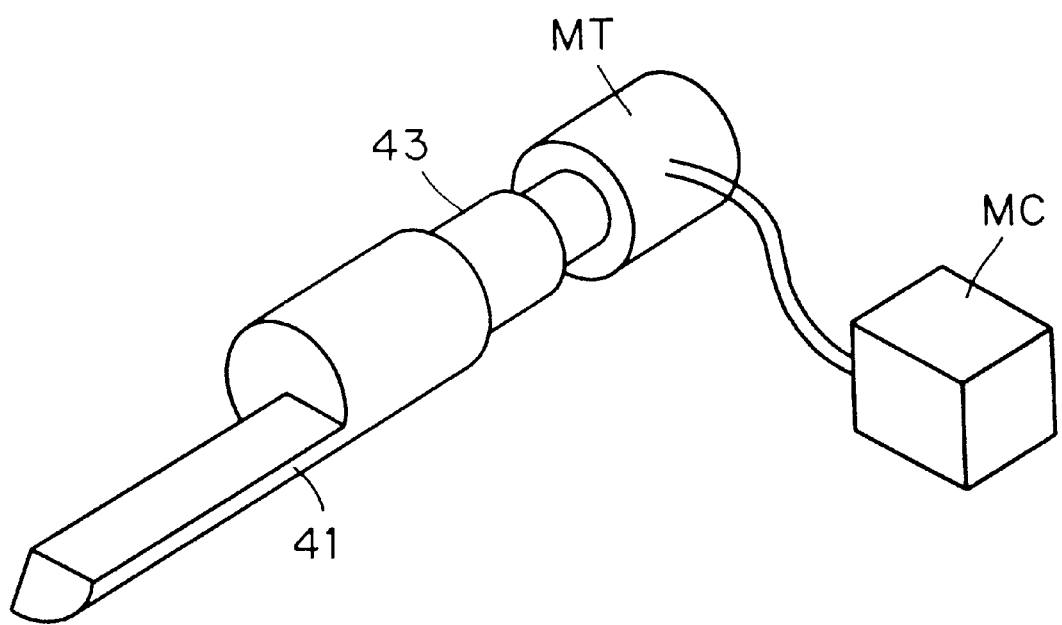

Although the driving unit 44 of FIG. 14 has the built-in rotary system such as a servo motor and the control device (motor control device) for the rotary system, the rotary system and the motor control device may be separated as shown in FIG. 15.

Specifically, in FIG. 15, the rotary strut 43 is connected to a servo motor MT, and the servo motor MT is connected to a motor control device MC.

Separating the motor and the motor control device allows size reduction of the driving unit 44. That reduces spacing restrictions in mounting the driving unit 44 on the die set 70 shown in FIG. 12, for example.

Furthermore, when the motor and the motor control device are separated, the external control device 80 of FIG. 14 is naturally connected to the motor control device MC.

As the board-thickness measuring device 90 for measuring the thickness of the lead 1 of the QFP 3 shown in FIG. 11 and 14, both a measuring device of contact type such as a dial gauge and that of non-contact type such as a laser displacement sensor may be used.

Figure 16:
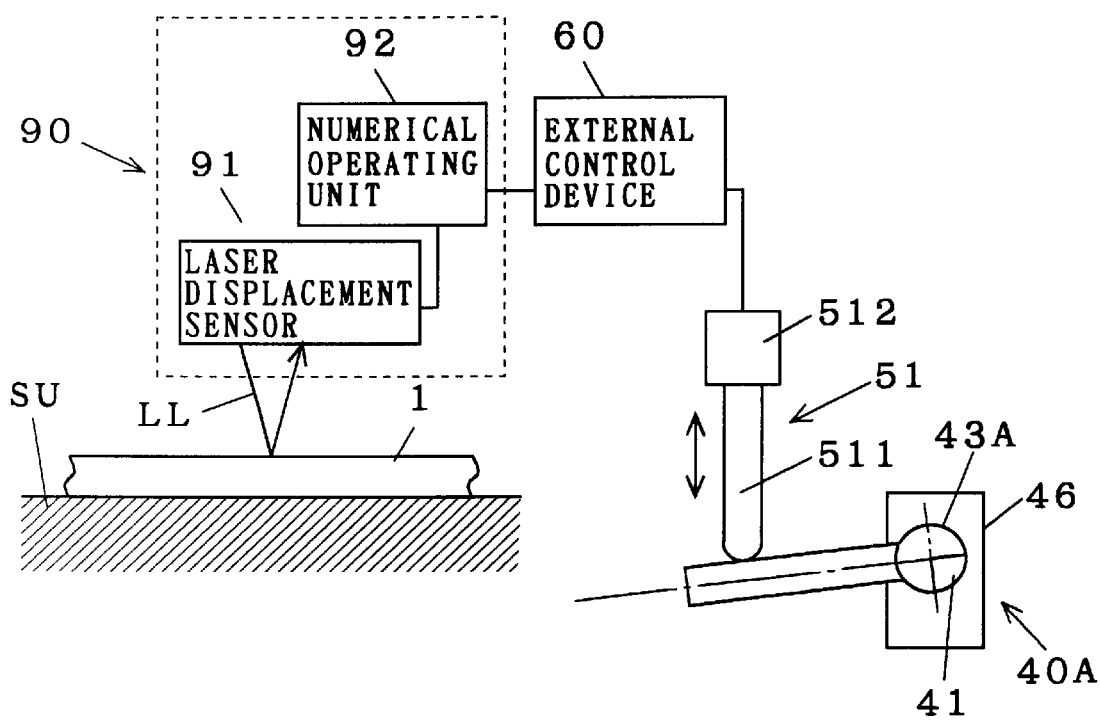
Figure 17:
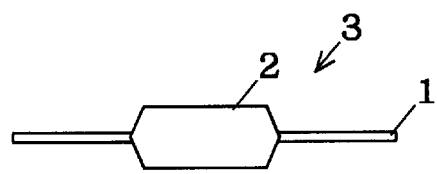
FIGS. 17 to 19 illustrate lead forming process steps in the background art.
Figure 18:
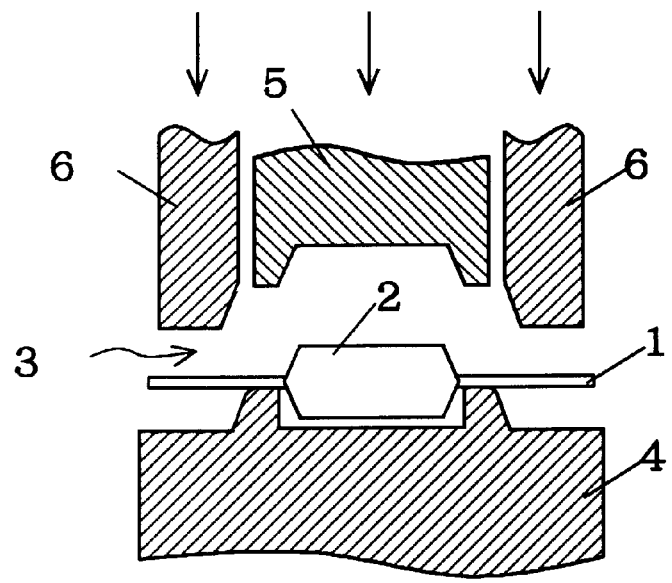
Figure 19:
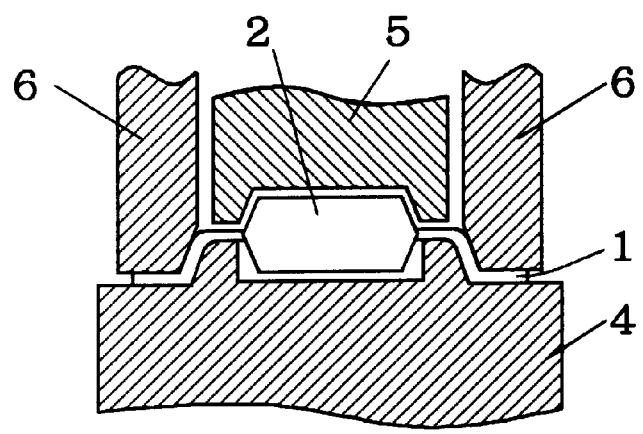
Figure 20:
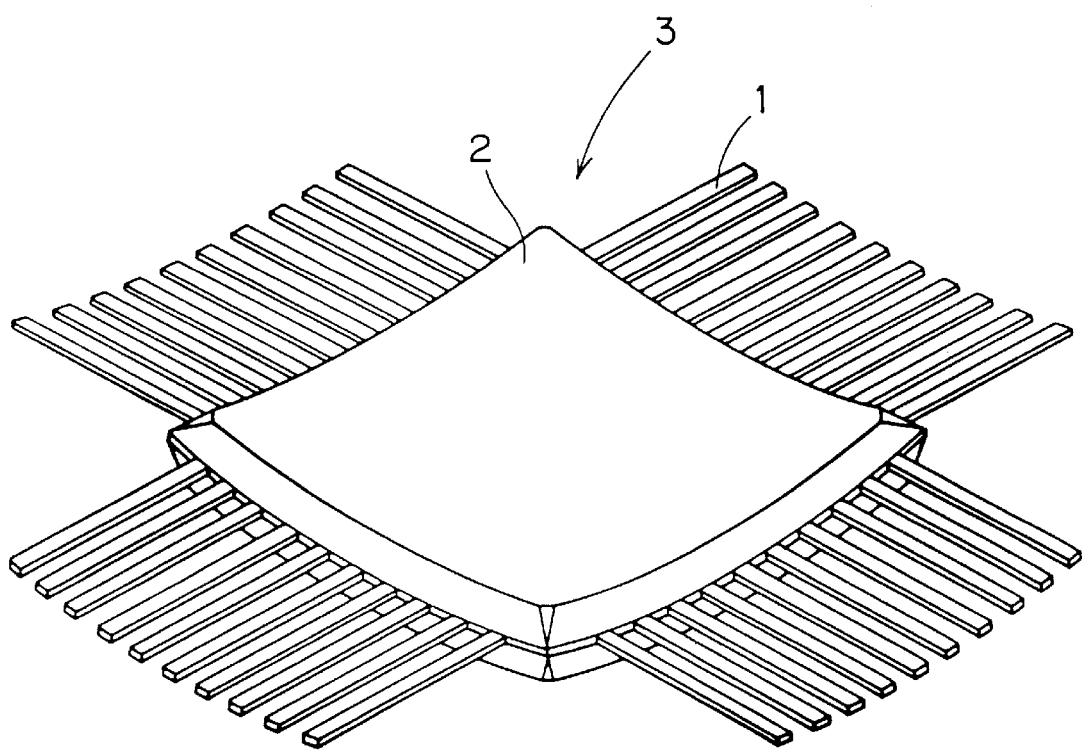
FIG. 20 is a perspective view showing a distortion of a package body of the QFP.
Figure 21:
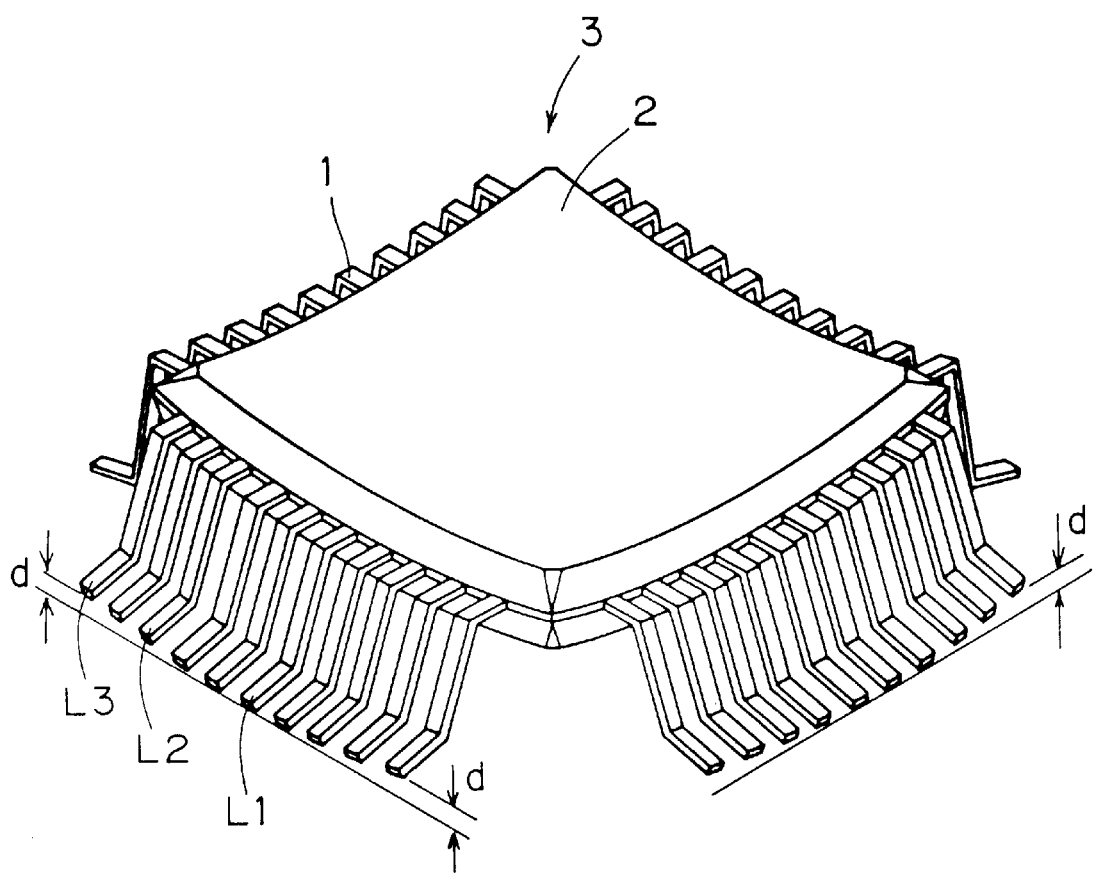
FIG. 21 is a perspective view of the QFP having distortion after the prebending process.

A construction to measure the thickness of the lead 1 of the QFP 3 using the laser displacement sensor will be discussed, referring to FIG. 16. In FIG. 16, this is applied to the lead bending device 40A.

As shown in FIG. 16, a laser light LL from a laser displacement sensor 91 is reflected by the surface of the lead 1 and goes back to the laser displacement sensor 91. The laser displacement sensor 91 gives the time from outgoing of the laser light LL to its return to a numerical operating unit 92. The numerical operating unit 92 calculates a distance from the lead 1 on the basis of the time. A distance from a suspending unit SU on which the leads 1 are mounted is measured in advance, and the numerical operating unit 92 further subtracts the distance from the lead 1 from the distance from the suspending unit SU, thus obtaining the thickness of the lead 1.

By giving a result of the above calculation to the external control device 60, it becomes possible to change the force of the rod 511 to push down the side lever 45 in accordance with the thickness of the lead 1 and determine the angle to be bent in the secondary bending process, taking the thickness of the lead 1 into account.

While the invention has been shown and described in detail, the foregoing description is in all aspects illustrative and not restrictive. It is therefore understood that numerous modifications and variations can be devised without departing from the upper die set of the invention.

We claim:

1. A lead forming apparatus for performing a bending process for leads having a first angle in a flat package comprising:

prebending means for performing a prebending process to bend said leads having said first angle so that main portions of said leads form a second angle and end portions of said leads form a third angle; and secondary bending means for performing a secondary bending process to bend said end portions of said leads having said third angle into a fourth angle, wherein said secondary bending means includes a forming die on which a package body of said flat package having said leads after said prebending process is mounted, lead bending means disposed surrounding said forming die in accordance with an arrangement of said lead, and a forming punch disposed in accordance with said arrangement of said leads, moving swingingly to contact said end portions of said leads having said third angle, said lead bending means includes a rotary lever, having a mounting surface on which said end portions of said leads having said third angle are mounted, rotatable to change an angle of said mounting surface with respect to a horizontal position, and wherein said end portions of said leads having said third angle are bent into said fourth angle by rotating said mounting surface towards said forming punch while said forming punch is in contact with said end portions of said leads having said third angle.

2. The lead forming apparatus of claim 1, wherein said package body includes a lower surface side located in a direction of bending said leads and an upper surface side opposite to said lower surface side, said secondary bending means includes a package holding jig which comes into contact with a substantial center portion of said upper surface side of said package body in said secondary bending process, said forming die has a concave portion for accommodating said lower surface side of said package body, and said package holding jig controls movement of said package body while suspending unit portions of said leads support said flat package in said secondary bending process.

3. The lead forming apparatus of claim 2, wherein said secondary bending means includes a holder for covering said upper surface side of said package body, said holder has a concave portion for accommodating said upper surface side of said package body, and said concave portion has such a depth as to produce a predetermined clearance between end edge portions of said holder and said leads after said prebending process.

4. The lead forming apparatus of claim 1, wherein said rotary lever comprises a divided piece of a cylinder in a lengthwise direction and said mounting surface is a flat surface of said divided piece, said lead bending means includes a rotary strut of cylindrical shape formed integrally with said rotary lever, for rotating said rotary lever, and a lever guide having a fitted guide surface for holding said rotary lever, and said lead bending means is disposed so that said end portions of said leads having said third angle may come into contact with said flat surface of said rotary lever which is said mounting surface while said package body is mounted on said forming die.

5. The lead forming apparatus of claim 4, wherein said lead bending means includes driving means for rotating said rotary strut, and said driving means has a motor connected to an end of said rotary strut and rotates said rotary strut at a predetermined angle in response to a control signal externally applied.

6. The lead forming apparatus of claim 4, wherein said lead bending means includes driving means for rotating said rotary strut, said driving means includes a side lever extending horizontally from a side surface of said rotary strut, and pushing-down means disposed on an upper portion of said side lever, for applying a force to push down said side lever, and said rotary strut is rotated at a predetermined angle by pushing down said side lever by a predetermined distance.

7. The lead forming apparatus of claim 6, further comprising a die set including a vertically moving upper die set and a lower die set, wherein said pushing-down means comprises a rod extensible to come into contact with said side lever, and a cylinder for extending said rod, said rotary lever, said lever guide and said rotary strut are mounted on said lower die set, said cylinder is disposed on a position of said upper die set corresponding to said upper portion of said side lever, and said upper die set descends and said rod extends to push down said side lever in said secondary bending process for said leads having said third angle.

8. The lead forming apparatus of claim 7, further comprising:
   first and second stoppers extending from surfaces of said upper die set and said lower die set facing each other,
   wherein said first and second stoppers come into contact with each other when said upper die set descends to a predetermined position, and
   said rod of said pushing-down means extends after said first and second stoppers contact each other.

9. A lead forming method, comprising steps of:
   (a) bending leads which are unformed into a first angle after mounting a flat package having said unformed leads on a first forming die having a peripheral surface with a slope of said first angle;
   (b) performing a prebending process to bend said leads having said first angle so that main portions of said leads form a second angle and end portions of said leads form a third angle by a first forming punch which moves swingingly to contact said end portions of said leads after mounting said flat package having said leads bent into said first angle on a second forming die having a slope of said second angle and a slope of said third angle provided on its peripheral surface in this order from its surface on which said flat package is mounted towards its periphery; and
   (c) performing a secondary bending process to bend only said end portions of said leads having said third angle into a fourth angle while a second forming punch moves swingingly to come into contact with said main portions of said leads having said second angle after mounting said flat package having said leads after said prebending process on a third forming die having a peripheral surface with a slope of said second angle,
   wherein said step (c) includes a step of
      rotating a rotary lever, having a mounting surface on which said end portions of said leads having said third angle are mounted, in a lead bending means disposed surrounding said third forming die in accordance with an arrangement of said leads extending from a package body, to change an angle of said mounting surface with respect to a horizontal position, and to move said mounting surface of said rotary lever towards said second forming punch while said second forming punch is in contact with said end portions of said leads.

10. The lead forming method of claim 9, wherein
   said package body includes a lower surface side located in a direction of bending said leads and an upper surface side opposite to said lower surface side,
   said third forming die has a concave portion for accommodating said lower surface side of said package body, and
   said step (c) includes a step of
      controlling movement of said package body by a package holding jig which comes into contact with a substantial center portion of said upper surface side of said package body while suspending unit portions of said leads support said flat package when said flat package having said leads after said prebending process is inserted in said concave portion.

11. The lead forming method of claim 10, wherein
   said first angle is smaller than said second angle, and
   said step (a) includes a step of
      bending unformed leads into said leads having said first angle by descending said third forming punch having such a slope as to fit to said slope of said first angle of said first forming die from above said unformed leads to hold said unformed leads between said third forming punch and said slope of said first angle of said first forming die.

12. The lead forming method of claim 10, wherein
   said first angle is smaller than said second angle, and
   said step (a) includes a step of
      bending said unformed leads into said leads having said first angle by descending a roller from above said unformed leads and rotating said roller to move along said unformed leads to hold said unformed leads between a cylindrical surface of said roller and said slope of said first angle of said first forming die.

* * * * *